United States Patent
Chan et al.

(10) Patent No.: US 7,589,561 B1
(45) Date of Patent: Sep. 15, 2009

(54) TOLERANT CMOS RECEIVER

(75) Inventors: Ying Poh Chan, Seri Kembangan (MY);
Bin Yan Ng, Jalan Batu Uban (MY)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/906,261

(22) Filed: Oct. 1, 2007

Related U.S. Application Data

(60) Provisional application No. 60/827,549, filed on Sep. 29, 2006.

(51) Int. Cl.
*H03K 19/0175* (2006.01)
(52) U.S. Cl. .............. 326/80; 326/81; 326/83
(58) Field of Classification Search .......... None
See application file for complete search history.

(56) References Cited

U.S. PATENT DOCUMENTS

| | | | | |
|---|---|---|---|---|
| 5,905,621 A * | 5/1999 | Drapkin | .................. | 361/111 |
| 6,956,412 B2 * | 10/2005 | Ohmori | .................. | 327/108 |
| 7,239,176 B2 * | 7/2007 | Gupta | .................. | 326/68 |

* cited by examiner

*Primary Examiner*—Anh Q Tran

(57) ABSTRACT

A system includes a complementary metal oxide semiconductor (CMOS) receiver, a first transistor, and a tracking circuit. The tracking circuit receives an input voltage and a reference voltage and selectively biases the first transistor to one of the input voltage and the reference voltage based on a comparison of the input voltage and the reference voltage. The CMOS receiver generates an output signal based on said comparison.

44 Claims, 13 Drawing Sheets

TOLERANT CMOS RECEIVER

CROSS-REFERENCE TO RELATED APPLICATIONS

This application claims the benefit of U.S. Provisional Application No. 60/827,549 filed on Sep. 29, 2006. The disclosure of the above application is incorporated herein by reference in its entirety.

FIELD

The present disclosure relates generally to CMOS receivers, and more particularly to enhancing the voltage tolerance of CMOS receivers.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Complimentary metal oxide semiconductor (CMOS) technology is used for a variety of digital logic and analog circuitry. As CMOS technology evolves, lithographic nodes used in CMOS fabrication are being scaled down. For example, a 65 nanometer lithographic node (65 nm process) enables the fabrication of minimum circuit features to reach 35 nanometers. Various factors such as reductions in die size, transistor size, and power consumption and increases in gate count, density, response time, and speed are driving the transition from a 90 nm process node to the 65 nm process node.

CMOS receivers (e.g. input buffers) are a type of special-purpose CMOS circuits. CMOS receivers are used to adjust distorted signals into well-defined digital signals having the proper pulse widths and amplitudes. In order to operate efficiently, high-speed systems may include CMOS receivers.

SUMMARY

A system includes a complementary metal oxide semiconductor (CMOS) receiver, a first transistor, and a tracking circuit that receives an input voltage and a reference voltage and that selectively biases the first transistor to one of the input voltage and the reference voltage based on a comparison of the input voltage and the reference voltage. The CMOS receiver generates an output signal based on the comparison.

In other features, the tracking circuit biases a control terminal of the first transistor to the reference voltage when the reference voltage exceeds the input voltage and the tracking circuit biases the control terminal of the first transistor to the input voltage when the input voltage exceeds the reference voltage. The CMOS receiver further includes a first set of transistors that includes the first transistor and a second transistor, wherein each of the first and second transistors includes a first terminal and a second terminal, the first terminal and the second terminal of the first transistor are coupled to the input voltage and the first terminal of the second transistor, respectively, and the second terminal of the second transistor is coupled to the output signal.

In other features, the tracking circuit includes a second set of transistors comprising a third transistor and a fourth transistor, and a well bias circuit that selectively biases respective bodies of the third transistor and the fourth transistor to one of the reference voltage and the input voltage. The well bias circuit includes a third set of transistors comprising a fifth transistor and a sixth transistor, wherein each of the fifth and sixth transistors include a first terminal, a second terminal, and a control terminal. The well bias circuit selectively biases the respective bodies of the third transistor and the fourth transistor based on a body signal at one of the first terminal of the fifth transistor and the first terminal of the sixth transistor. The first terminal, the second terminal, and the control terminal of the fifth transistor are coupled to the first terminal of the sixth transistor, the input voltage, and the reference voltage, respectively, and the second terminal and the control terminal of the sixth transistor are coupled to the reference voltage and the input voltage, respectively.

In other features, the first terminal of the fifth transistor is further coupled to a body of the fifth transistor and the first terminal of the sixth transistor is further coupled to a body of the sixth transistor. The output signal is less than or equal to a maximum operating voltage of the CMOS receiver. The first set of transistors includes n-channel metal oxide semiconductor (NMOS) transistors. The second set of transistors includes p-channel metal oxide semiconductor (PMOS) transistors. The third set of transistors includes p-channel metal oxide semiconductor (PMOS) transistors. The CMOS receiver further comprises a hysteresis circuit. The CMOS receiver further comprises a level shifter circuit.

A system includes a complementary metal oxide semiconductor (CMOS) receiver means for processing an input signal, a first transistor, and tracking means for receiving an input voltage and a reference voltage and for selectively biasing the first transistor to one of the input voltage and the reference voltage based on a comparison of the input voltage and the reference voltage. The CMOS receiver means generates an output signal based on the comparison.

In other features, the tracking means biases a control terminal of the first transistor to the reference voltage when the reference voltage exceeds the input voltage and the tracking circuit biases the control terminal of the first transistor to the input voltage when the input voltage exceeds the reference voltage. The CMOS receiver means further includes a first set of transistors that includes the first transistor and a second transistor, wherein each of the first and second transistors includes a first terminal and a second terminal, the first terminal and the second terminal of the first transistor are coupled to the input voltage and the first terminal of the second transistor, respectively, and the second terminal of the second transistor is coupled to the output signal.

In other features, the tracking means includes a second set of transistors comprising a third transistor and a fourth transistor, and well bias means for selectively biasing respective bodies of the third transistor and the fourth transistor to one of the reference voltage and the input voltage. The well bias means includes a third set of transistors comprising a fifth transistor and a sixth transistor, wherein each of the fifth and sixth transistors include a first terminal, a second terminal, and a control terminal. The well bias means selectively biases the respective bodies of the third transistor and the fourth transistor based on a body signal at one of the first terminal of the fifth transistor and the first terminal of the sixth transistor. The first terminal, the second terminal, and the control terminal of the fifth transistor are coupled to the first terminal of the sixth transistor, the input voltage, and the reference voltage, respectively, and the second terminal and the control terminal of the sixth transistor are coupled to the reference voltage and the input voltage, respectively.

In other features, the first terminal of the fifth transistor is further coupled to a body of the fifth transistor and the first terminal of the sixth transistor is further coupled to a body of the sixth transistor. The output signal is less than or equal to a maximum operating voltage of the CMOS receiver means. The first set of transistors includes n-channel metal oxide semiconductor (NMOS) transistors. The second set of transistors includes p-channel metal oxide semiconductor (PMOS) transistors. The third set of transistors includes p-channel metal oxide semiconductor (PMOS) transistors. The CMOS receiver means further comprises hysteresis means for providing hysteresis to the output signal. The CMOS receiver means further comprises level shifter means for shifting a level of the output signal.

A method of operating a complementary metal oxide semiconductor (CMOS) receiver includes receiving an input voltage and a reference voltage at a tracking circuit, comparing the input voltage and the reference voltage, selectively biasing a first transistor to one of the input voltage and the reference voltage based on the comparison, and generating an output signal based on the comparison.

In other features, the method further includes biasing a control terminal of the first transistor to the reference voltage when the reference voltage exceeds the input voltage, and biasing the control terminal of the first transistor to the input voltage when the input voltage exceeds the reference voltage. The method further includes providing a first set of transistors that includes the first transistor and a second transistor, wherein each of the first and second transistors includes a first terminal and a second terminal, the first terminal and the second terminal of the first transistor are coupled to the input voltage and the first terminal of the second transistor, respectively, and the second terminal of the second transistor is coupled to the output signal.

In other features, the method further includes providing a second set of transistors comprising a third transistor and a fourth transistor, and selectively biasing respective bodies of the third transistor and the fourth transistor to one of the reference voltage and the input voltage. The method further includes providing a third set of transistors comprising a fifth transistor and a sixth transistor, wherein each of the fifth and sixth transistors include a first terminal, a second terminal, and a control terminal. The method further includes selectively biasing the respective bodies of the third transistor and the fourth transistor based on a body signal at one of the first terminal of the fifth transistor and the first terminal of the sixth transistor. The first terminal, the second terminal, and the control terminal of the fifth transistor are coupled to the first terminal of the sixth transistor, the input voltage, and the reference voltage, respectively, and the second terminal and the control terminal of the sixth transistor are coupled to the reference voltage and the input voltage, respectively.

In other features, the first terminal of the fifth transistor is further coupled to a body of the fifth transistor and the first terminal of the sixth transistor is further coupled to a body of the sixth transistor. The output signal is less than or equal to a maximum operating voltage of the CMOS receiver. The first set of transistors includes n-channel metal oxide semiconductor (NMOS) transistors. The second set of transistors includes p-channel metal oxide semiconductor (PMOS) transistors. The third set of transistors includes p-channel metal oxide semiconductor (PMOS) transistors. The CMOS receiver further comprises a hysteresis circuit. The CMOS receiver further comprises a level shifter circuit.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
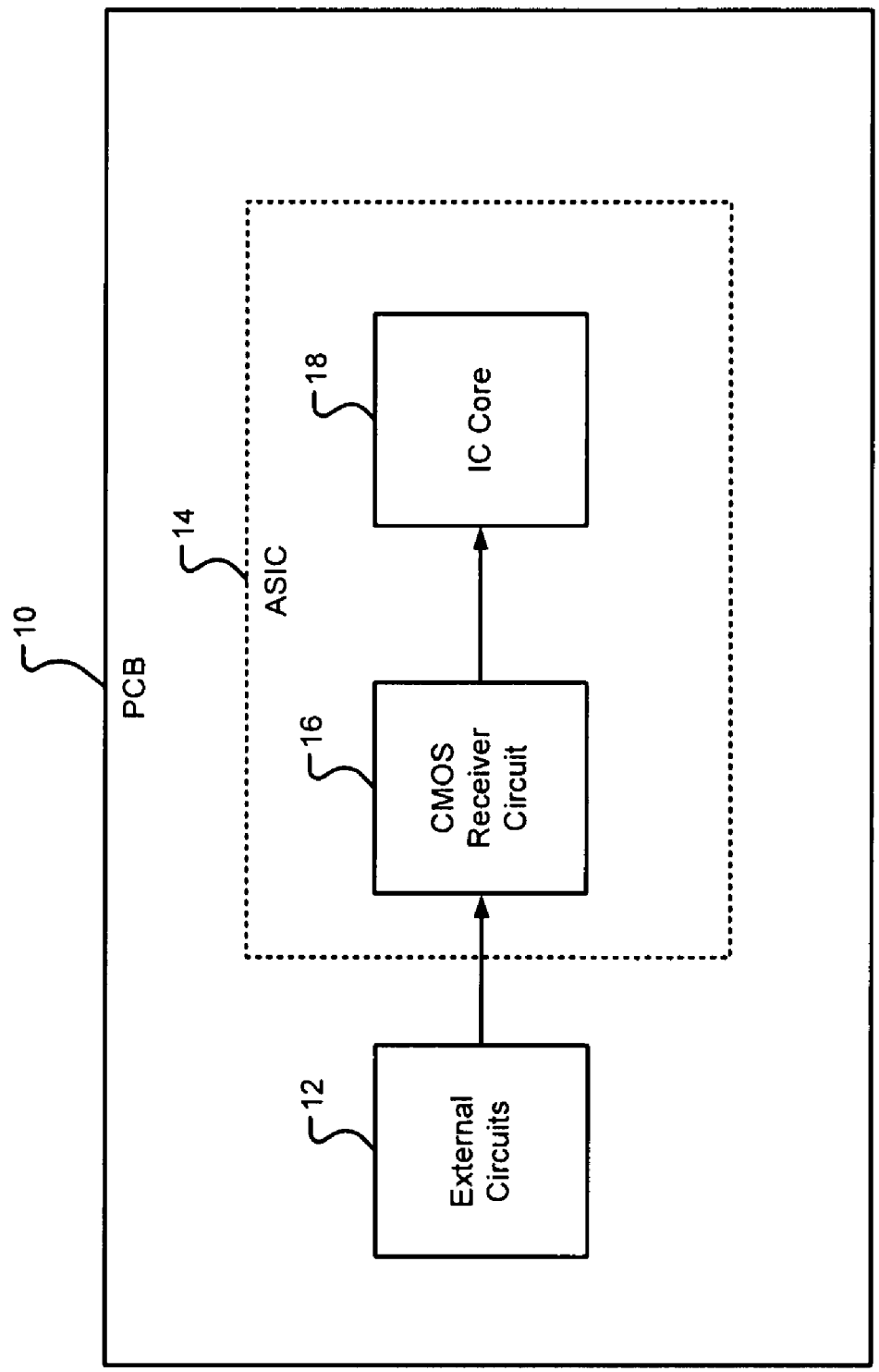
FIG. 1 is a functional block diagram of a printed circuit board according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Generally, as CMOS technology scales down to the next process node, the power requirements of an integrated circuit (IC) implementing the smaller CMOS process node also decreases. For example, high voltage transistors and low voltage transistors formed via the 130 nanometer (nm) process node typically use 3.3 Volts and 1.2 Volts (3.3V/1.2V), respectively. These voltage levels are provided by a 3.3V/1.2V power supply. In contrast, high voltage transistors and low voltage transistors of the 65 nm process node require 1.8V/1.0V, respectively, provided by a 1.8V/1.0V power supply.

A miniaturization pace of printed circuit boards (PCBs) that supply power to the ICs generally does not correlate with a pace of transitions in CMOS technology. PCBs designed for use with ICs manufactured via a 130 nm process may be used with ICs manufactured via the 65 nm process. In other words, the ICs and/or other devices that operate in the 130 nm process continue to supply, for example, input signals ranging up to 3.3V to ICs fabricated via the 65 nm process that ideally operate at 1.8V/1.0V. As a result, transistors fabricated via the 65 nm may be stressed above maximum operating voltages (e.g. 1.98 Volts), thereby causing reliability issues such as hot-carrier degradation, gate oxide breakdown, and/or an undesired leakage path. The present disclosure describes an interface circuit that enables ICs fabricated via the 65 nm technology node to tolerate variable input signals ranging to 3.3V.

Referring now to FIG. 1, a PCB 10 is shown to include external circuits 12 (i.e. circuits and/or devices external to an ASIC 14) and the ASIC 14. The external circuits 12 supply an input signal to the ASIC 14. The input signal may include a "swing" or variable pad voltage (input Vpad). In the present implementation, Vpad includes a transient pulse having a 0 Volt to 3.3 Volt (0-3.3V) rail-to-rail potential, although other voltage potentials on the input signal are contemplated. The ASIC 14 includes an exemplary CMOS receiver circuit 16 that implements the interface circuit and an IC core 18. The CMOS receiver circuit 16 receives and processes the input signal in order to ensure proper pulse widths and amplitudes. The CMOS receiver circuit 16 transmits the input signal to the IC core 18 for further processing. The present implementation contemplates the ASIC 14 being fabricated via the 65 nm process. Therefore the ASIC 14 includes high voltage and low voltage transistors that ideally operate at 1.8 Volts and 1.0 Volts, respectively.

Figure 2:
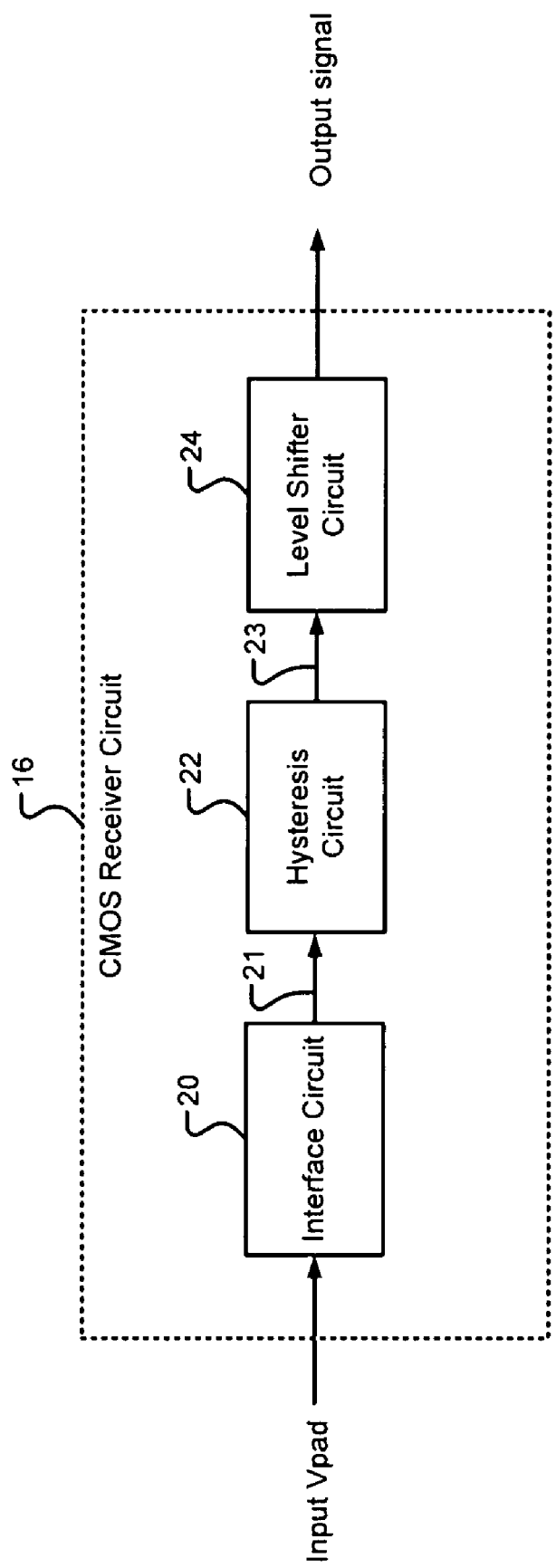
FIG. 2 is a functional block diagram of receiver circuit according to the present disclosure.

Referring now to FIG. 2, the CMOS receiver circuit 16 is shown in more detail. The CMOS receiver circuit 16 implements the interface circuit according to the present disclosure and is shown to include an interface circuit 20, a hysteresis circuit 22, and a level shifter circuit 24.

The interface circuit 20 enables ICs fabricated via the 65 nm process to tolerate input signals that include varying voltage levels (e.g. 0-3.3V). The interface circuit 20 receives the input signal (i.e. input Vpad) from the PCB 10 via the external circuits 12. The hysteresis circuit 22 receives a signal 21 from the interface circuit 20. The hysteresis circuit 22 filters and provides hysteresis to the signal 21. In various embodiments, the hysteresis circuit 22 may include, but is not limited to, a Schmitt trigger circuit. The level shifter circuit 24 receives a signal 23 from the hysteresis circuit 22 and provides a direct current (DC) level shift to the signal 23 for use by the IC core 18. The level shifter circuit 24 then transmits an output signal to the IC core 18 of the ASIC 14.

Figure 3:
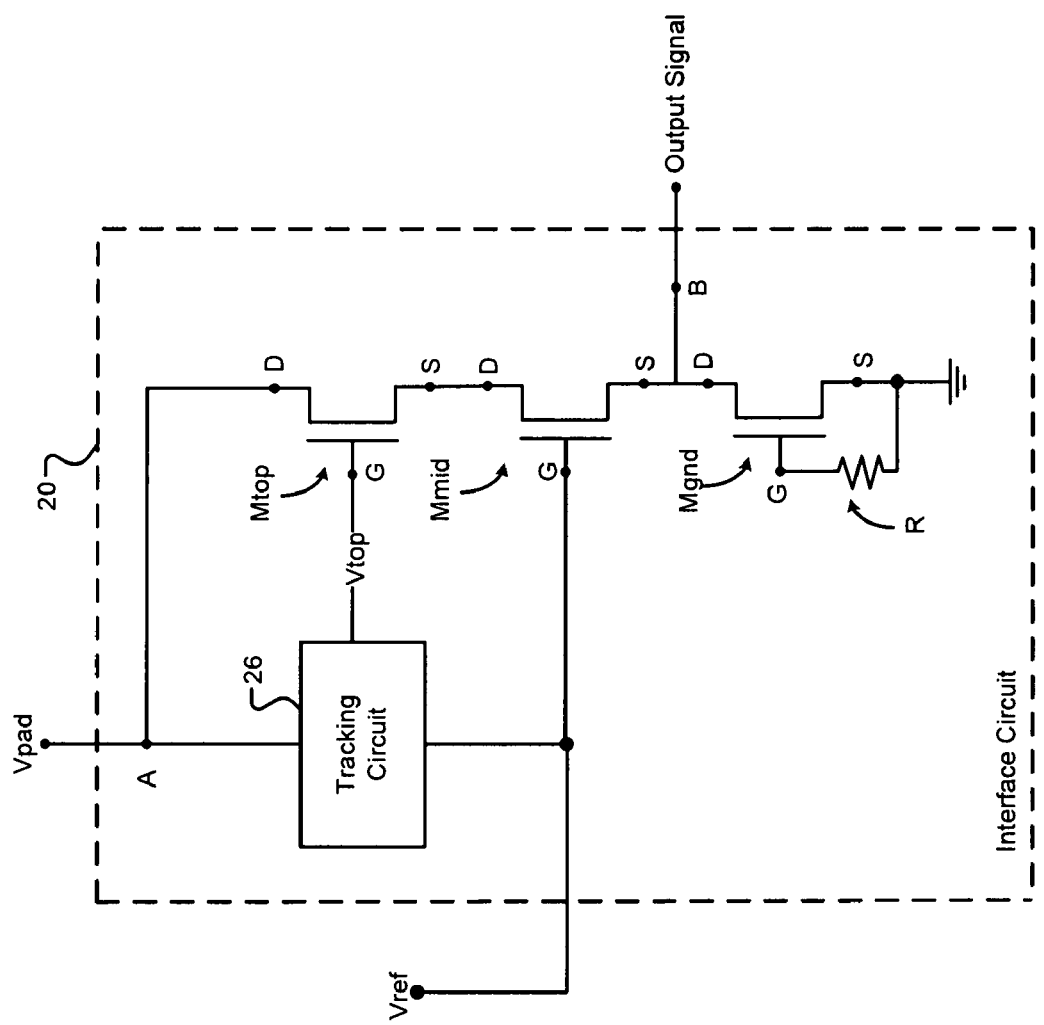
FIG. 3 is a functional block diagram of an interface circuit according to the present disclosure.

Referring now to FIG. 3, an exemplary implementation of the interface circuit 20 is shown in more detail. The interface circuit 20 includes a tracking circuit 26 and switches Mtop, Mmid, and Mgnd. In the present implementation, the switches Mtop, Mmid, and Mgnd include n-channel metal oxide semiconductor (NMOS) transistors, although other types of transistors are contemplated. The interface circuit 20 receives the input Vpad at an input node A. The tracking circuit 26 and a drain (D) terminal of the transistor Mtop are commonly coupled to the input node A. The tracking circuit 26 is coupled to gate (G) terminals of each of the transistors Mtop and Mmid. A source (S) terminal of the transistor Mtop is coupled to a drain terminal of the transistor Mmid. A source terminal of the transistor Mmid is coupled to a drain terminal of the transistor Mgnd. A gate terminal of the transistor Mgnd is coupled to a first end of a resistor (R). A second end of the R and a source terminal of the transistor Mgnd are each coupled to a ground terminal. The interface circuit 20 generates the output signal at an output node B.

The tracking circuit 26 selectively biases, or drives, the gate terminal of the transistor Mtop with a biasing signal (Vtop). For example, the tracking circuit 26 compares the input Vpad to a reference voltage (Vref). In the present implementation, Vref includes 1.8 Volts, although other voltage potentials are contemplated based on the semiconductor processing node implemented. If the input Vpad is greater than the Vref, the tracking circuit 26 drives the gate terminal of the transistor Mtop with input Vpad. If the Vref exceeds the input Vpad, the tracking circuit 26 drives the gate terminal of the transistor Mtop with the Vref. Therefore, the biasing signal Vtop corresponds to one of the input Vpad and the Vref. In other words, the tracking circuit 26 drives the gate terminal of the transistor Mtop with the highest voltage available amongst the input Vpad and the Vref. The gate terminal of the transistor Mmid receives Vref. Therefore, in the present implementation, the gate terminal of the transistor Mmid is biased to 1.8V. As a result, the output signal includes a voltage swing that falls within the proper functionality range of a following stage (i.e. the hysteresis circuit 22).

Figure 4:
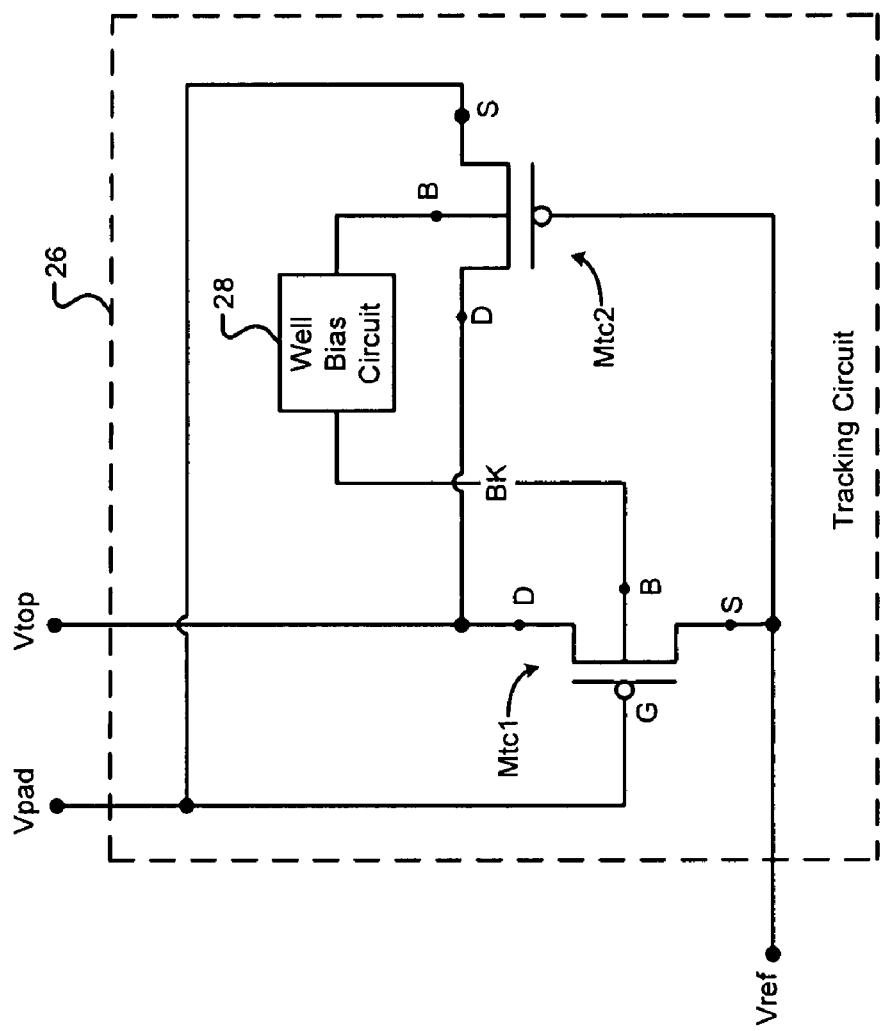
FIG. 4 is a functional block diagram of a tracking circuit according to the present disclosure.

Referring now to FIGS. 3 and 4, the tracking circuit 26 is shown in more detail. The tracking circuit 26 includes a well bias circuit 28, a switch Mtc1, and a switch Mtc2. In the present implementation, switches Mtc1 and Mtc2 include p-channel MOS (PMOS) transistors, although other types of transistors are contemplated.

The input Vpad and the Vref drive the transistors Mtc1 and Mtc2, respectively. For example, the transistor Mtc1 is turned on (i.e. switched to a conducting state) or off (i.e. switched to a non-conducting state) based on the input Vpad. The transistor Mtc1 receives the input Vpad at a gate terminal of the transistor Mtc1. Similarly, the transistor Mtc2 is turned on or off based on Vref received at a gate terminal of Mtc2. Drain terminals of the transistors Mtc1 and Mtc2 are each coupled to Vtop. As discussed above with reference to FIG. 3, Vtop drives the transistor Mtop. As a result, the state of operation of the transistor Mtop is based on either the input Vpad or the Vref. Sources of the transistors Mtc1 and Mtc2 are tied to the Vref and the input Vpad, respectively. The well bias circuit 28 ties the bodies, or bulks, of various transistors to the highest voltage available between the input Vpad and the Vref.

Figure 5:
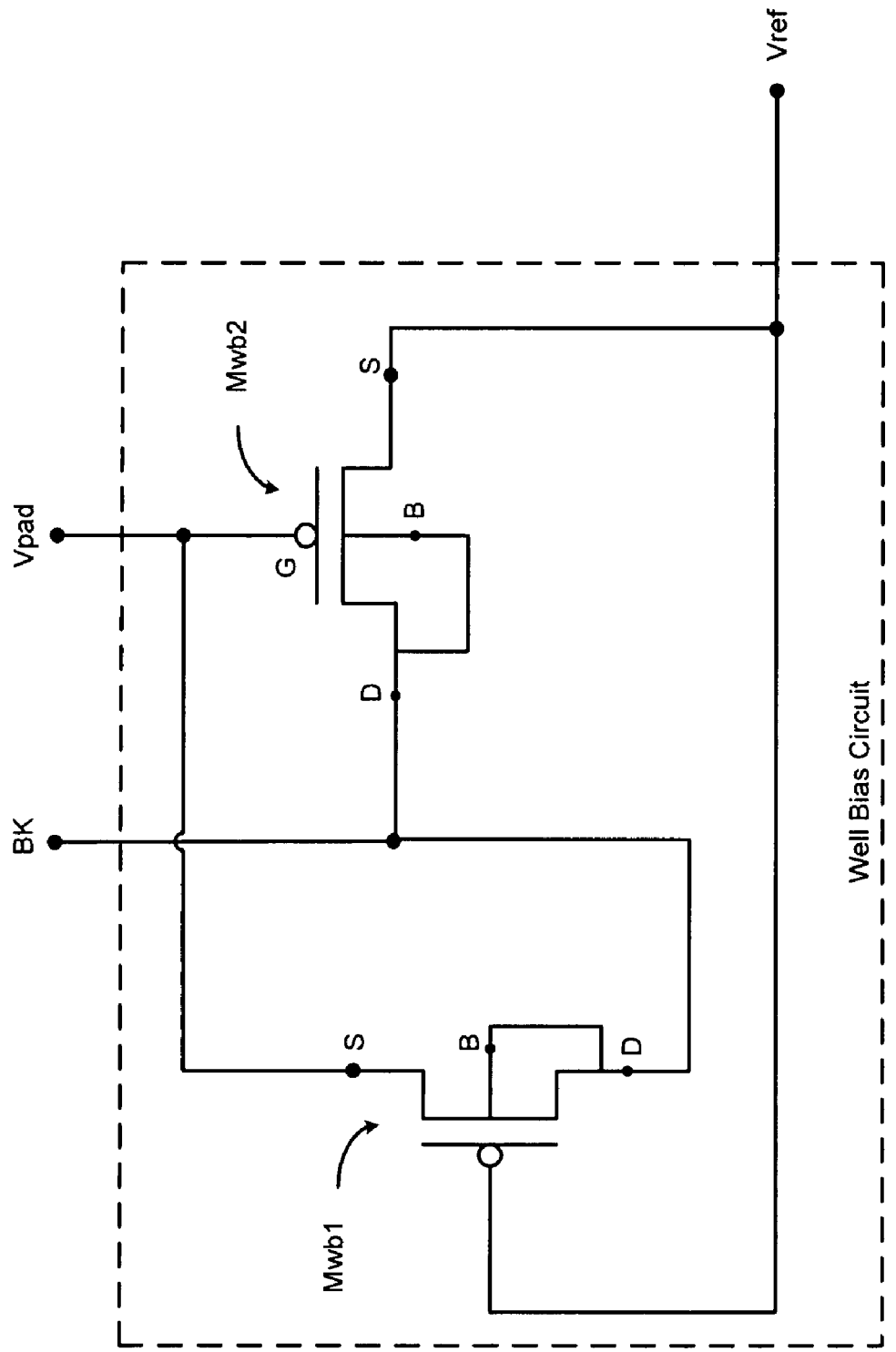
FIG. 5 is a functional block diagram of a well bias circuit according to the present disclosure.

Referring now to FIG. 5, the well bias circuit 28 is shown in more detail. The well bias circuit 28 includes switches Mwb1 and Mwb2. In the present implementation, the switches Mwb1 and Mwb2 include PMOS transistors, although other types of transistors are contemplated.

The well bias circuit 28 ties the bodies (B) of the transistors Mtc1, Mtc2, Mwb1, and Mwb2, referred to collectively as the transistors, to one of the Vref and the input Vpad to avoid parasitic bulk diode effects. Parasitic bulk diodes may turn on during operation (i.e. switching) of the transistors, thereby causing the CMOS receiver circuit 16 to function improperly.

The body of the transistor Mwb1 is coupled to the drain terminal of transistor Mwb1, and a body of the transistor Mwb2 is coupled to a drain terminal of the transistor Mwb2, thereby tying the bodies of transistors Mwb1 and Mwb2 to the voltages present at the drain terminals of the transistors Mwb1 and Mwb2, respectively. Furthermore, the drain terminals of each of the transistors Mwb1 and Mwb2 are coupled together. The transistors Mwb1 and Mwb2 are turned on and off based on the inputs Vpad and Vref, respectively.

The input Vpad biases the source terminal of the transistor Mwb1 and drives the gate terminal of the transistor Mwb2. Vref biases the source terminal of the transistor Mwb2 and drives the gate of the transistor Mwb1. A body (BK) signal is based on either the input Vpad or the Vref. During operation, the well bias circuit 28 outputs the BK signal to bias each of the bodies of the transistors, respectively.

Referring now to FIGS. 4, 5, 6A and 6B, the operation of the interface system is described in further detail. During operation, the external circuit 12 (e.g. as shown in FIG. 1) supplies the input Vpad. As noted previously, the input Vpad can include a transient pulse signal having a 0-3.3V rail-to-rail potential. Additionally, in the present implementation, each of the respective transistors are assumed to include an exemplary threshold voltage (Vth) having an absolute value of 0.4 V.

When the input Vpad equals a first rail voltage (i.e. 0.0 Volts) of the 0-3.3V rail-to-rail potential, the transistor Mtc2 is turned off ("open") and in a non-conducting state. In contrast, transistor Mtc1 is turned on ("closed") and in a conducting state, thereby coupling the Vtop to the Vref. In other words, the Vtop equals Vref when the input Vpad equals 0.0 Volts. As noted above, other voltage potentials on the input signal are contemplated based on based on the semiconductor processing node implemented.

Referring to FIG. 5, as discussed previously, the well bias circuit 28 ensures that the respective bodies (i.e. n-type wells) of the transistors are coupled to the highest voltage potential (i.e. either the Vref or the input Vpad) in order to avoid an activation of parasitic diodes that can result in undesired leakage. Therefore, when the input Vpad equals 0.0 Volts, the transistor Mwb1 is turned off and in a non-conducting state whereas Mwb2 is turned on and in a conducting state. As a result, the BK signal rises to Vref (i.e. 1.8 Volts) and is operative to bias the bodies of transistors.

Figure 6A:
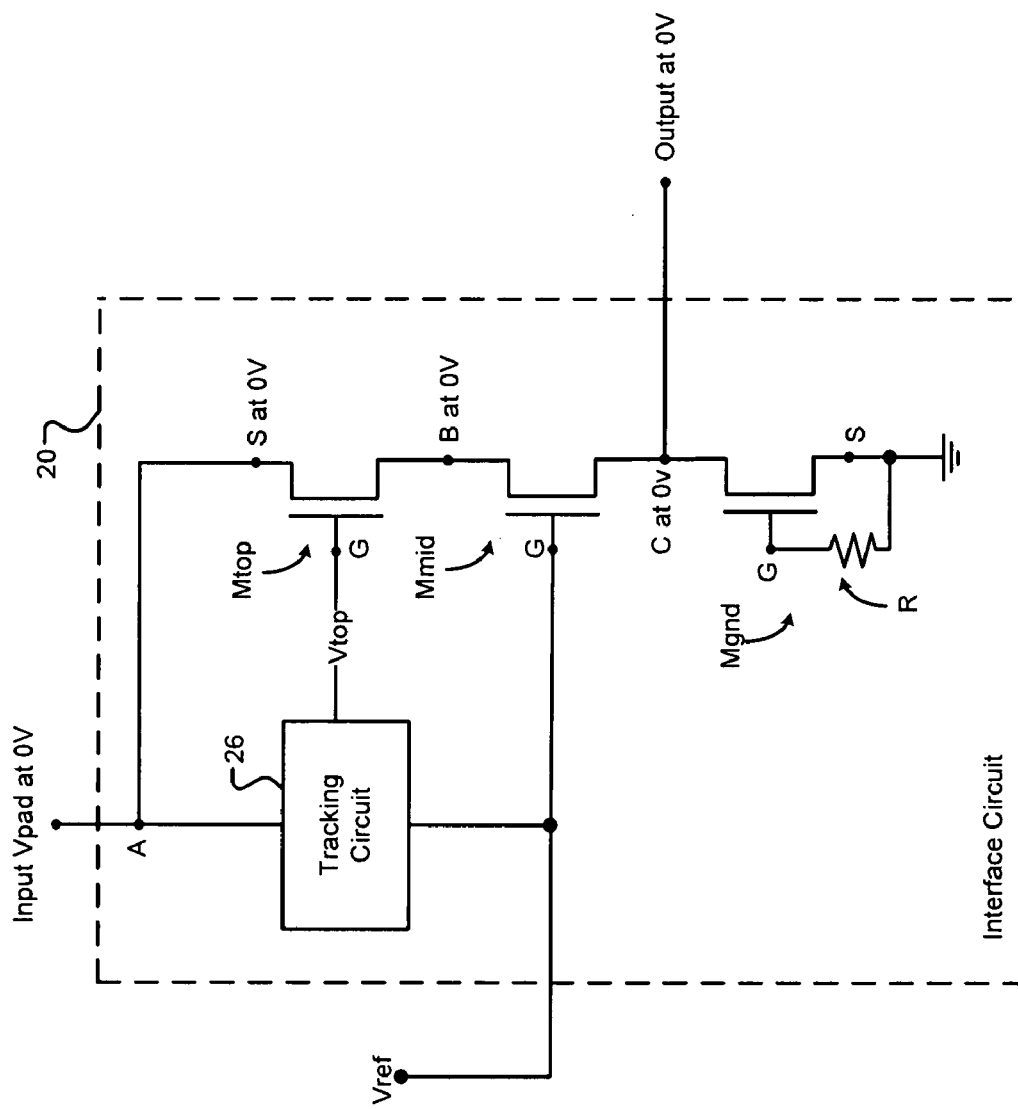
FIG. 6A illustrates the operation of the interface circuit according to the present disclosure.

FIG. 6A illustrates exemplary voltage potentials across the interface circuit 20 when the interface circuit 20 receives an input Vpad equaling the first rail voltage. The gate terminal of the transistor Mmid receives Vtop which equals Vref. The transistor Mtop is turned on based on Vtop. Similarly, the transistor Mmid is turned on based on receiving Vref. As described above, the drain terminal of the transistor Mtop is tied to the input Vpad and a voltage at the drain terminal of the transistor Mtop equals the input Vpad (i.e. 0.0 Volts). The transistor Mtop transmits the input Vpad to the node C. The respective source terminal and drain terminal of the transistors Mtop and Mmid are coupled at the common node C which has a voltage potential of 0.0 Volts. The transistor Mmid then transmits the input Vpad to output node B. The respective source terminal and drain terminal of the transistors Mmid and Mgnd are coupled at the output node B which has a voltage potential of 0.0 Volts. The interface circuit 20 generates the output signal at the output node B. When the input Vpad equals 0.0 Volts, the output signal transmitted to the hysteresis circuit 22 correspondingly equals 0.0 Volts.

Additionally, each of the respective terminals (i.e. gate terminals, sources, and drain terminals) of the transistors Mtop, Mmid, and Mgnd, referred to collectively as the interface transistors, remain "under stressed." In other words, the voltages across the terminals remain less than 1.98 Volts, or the maximum operating voltage for transistors fabricated via the 65 nm process. For example, a gate-to-source voltage (Vgs), a gate-to-drain voltage (Vgd), and a drain-to-source voltage (Vds) for transistors Mtop and Mmid respectively equal 1.8 Volts, 1.8 Volts, and 0.0 Volts when the input Vpad equals 0.0 Volts.

Referring to FIG. 4, when the input Vpad equals a second rail voltage (i.e. 3.3 Volts) of the 0-3.3V rail-to-rail potential, the transistor Mtc1 is turned off ("open") and in a non-conducting state. In contrast, transistor Mtc2 is turned on ("closed") and in a conducting state, thereby coupling the Vtop to the input Vpad. In other words, the Vtop equals the input Vpad when the input Vpad equals 3.3 Volts (i.e. the input Vpad exceeds Vref). As noted above, other voltage potentials on the input signal are contemplated based on the semiconductor processing node implemented.

Referring to FIG. 5, when the input Vpad equals 3.3 Volts, the transistor Mwb1 is turned on and in a conducting state whereas Mwb2 is turned off and in a non-conducting state. As a result, the BK signal rises to the input Vpad (i.e. 3.3 Volts) and biases the bodies of the each of the transistors.

Figure 6B:
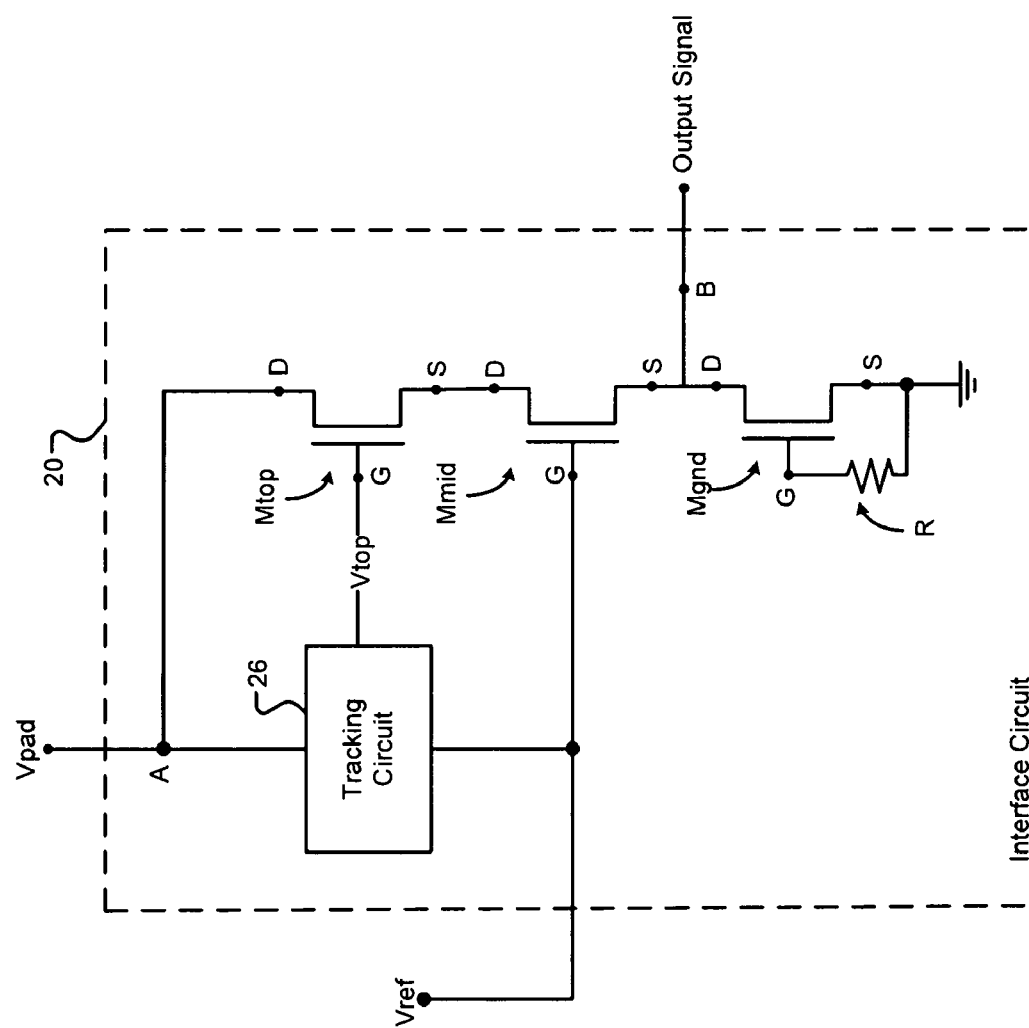
FIG. 6B illustrates the operation of the interface circuit according to the present disclosure.

FIG. 6B illustrates exemplary voltage potentials across the interface circuit 20 when the interface circuit 20 receives an input Vpad equaling the second rail voltage (i.e. 3.3 Volts). The gate terminal of the transistor Mmid receives Vtop which equals the input Vpad. The transistor Mtop is turned on based on Vtop. Similarly, the transistor Mmid is turned on based on receiving the Vref. A voltage at the source terminal of the transistor Mtop equals the input Vpad (i.e. 3.3 Volts).

The voltage at the source terminal of the transistor Mtop experiences a first voltage drop across the transistor Mtop (i.e. from the respective drain terminal to source terminal of the transistor Mtop). In the present implementation, the first voltage drop voltage equals 0.4 Volts resulting in a voltage potential at the node C of 2.9 Volts. As noted in FIG. 6A, the respective source terminal and drain terminal of transistors Mtop and Mmid are coupled at the common node C. The voltage at node C then experiences a second voltage drop across the transistor Mmid (i.e. from the respective drain terminal to source terminal of the transistor Mmid). In the present implementation, the second voltage drop equals 1.5 Volts, resulting in a voltage at the output node B of 1.4 Volts. Therefore, when the input Vpad equals 3.3 Volts (i.e. the second rail voltage), the output signal transmitted to the hysteresis circuit 22 equals 1.4 Volts.

As such, voltages across the respective terminals also remain within the maximum operating voltage for transistors fabricated via the 65 nm process, thereby ensuring proper functionality while avoiding issues related to over-stressing of the transistors. For example, the Vgs, the Vgd, and the Vds of the transistor Mtop respectively equal 0.4 Volts, 0.0 Volts, and 0.4 Volts when the input Vpad equals 3.3 Volts.

Figure 7:
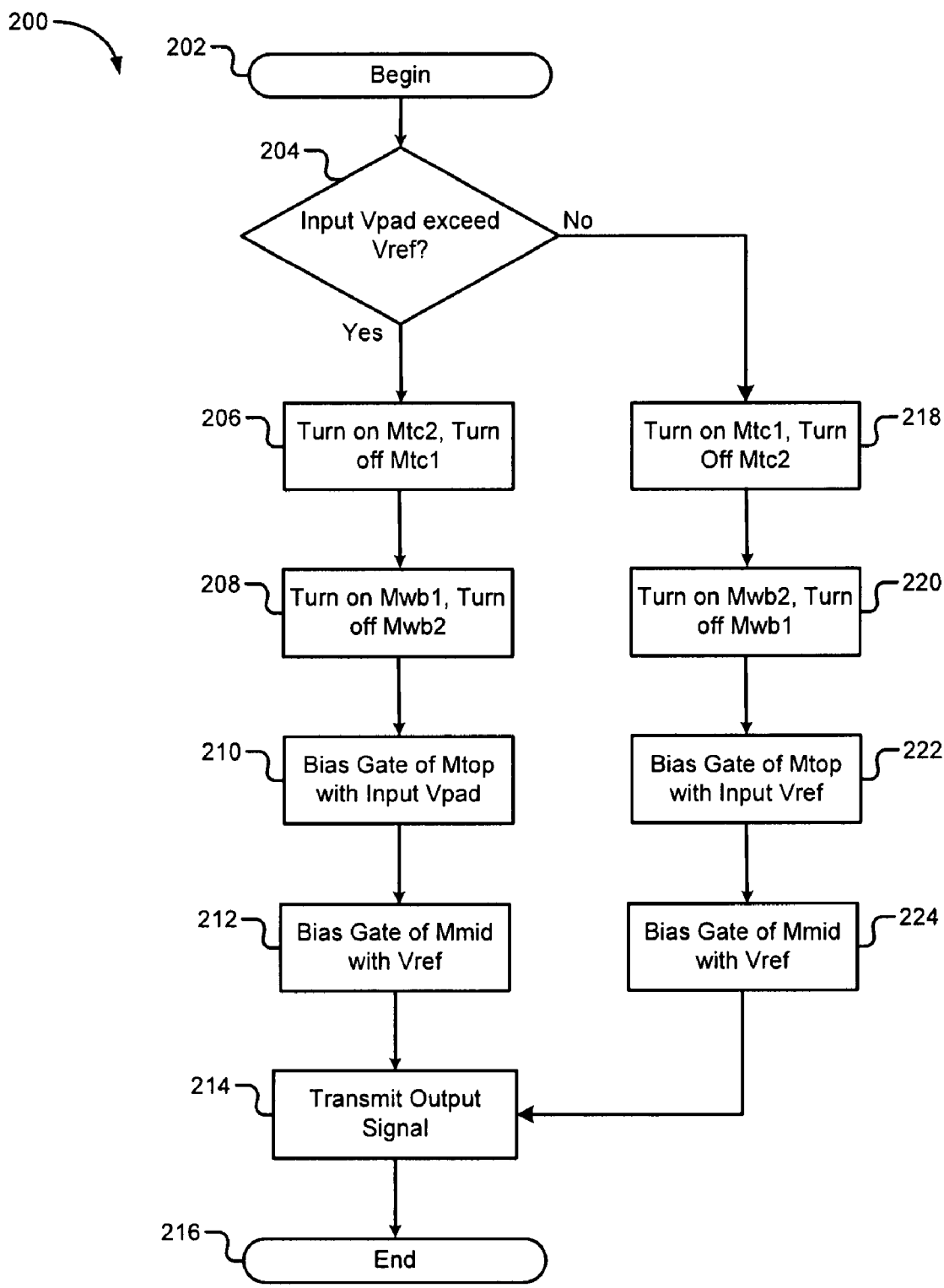
FIG. 7 is a flow diagram illustrating steps of a method for operating the interface circuit according to the present disclosure.

Referring now to FIG. 7, a method 200 for operating the CMOS receiver circuit 16 is shown in more detail. The method 200 begins in step 202. In step 204, the tracking circuit 26 determines whether an input voltage (e.g. input Vpad) exceeds a reference voltage (e.g. Vref). If the input Vpad exceeds the Vref, the method 200 proceeds to step 206. If the input Vpad does not exceed the Vref, the method 200 proceeds to step 218.

In step 206, the transistors Mtc1 and Mtc2 turn off and turn on, respectively. In step 208, the transistors Mwb1 and Mwb2 turn on and turn off, respectively. In step 210, the gate terminal of Mtop is biased with the input Vpad. In step 212, the gate terminal of Mmid is biased with the Vref. The method 200 proceeds to step 214.

Referring back to step 204, if the input Vpad does not exceed the Vref, the transistors Mtc1 and Mtc2 turn on and turn off, respectively, in step 218. In step 220, the transistors Mwb1 and Mwb2 turn off and turn on, respectively. In step 222, the gate terminal of Mtop is biased with the Vref. In step 224, the gate terminal of Mmid is biased with the Vref. In step 214, the interface circuit 20 transmits an output signal to the hysteresis circuit 22. In step 216, the method 200 ends.

FIGS. 8A-8G, various exemplary implementations incorporating the teachings of the present disclosure are shown.

Figure 8A:
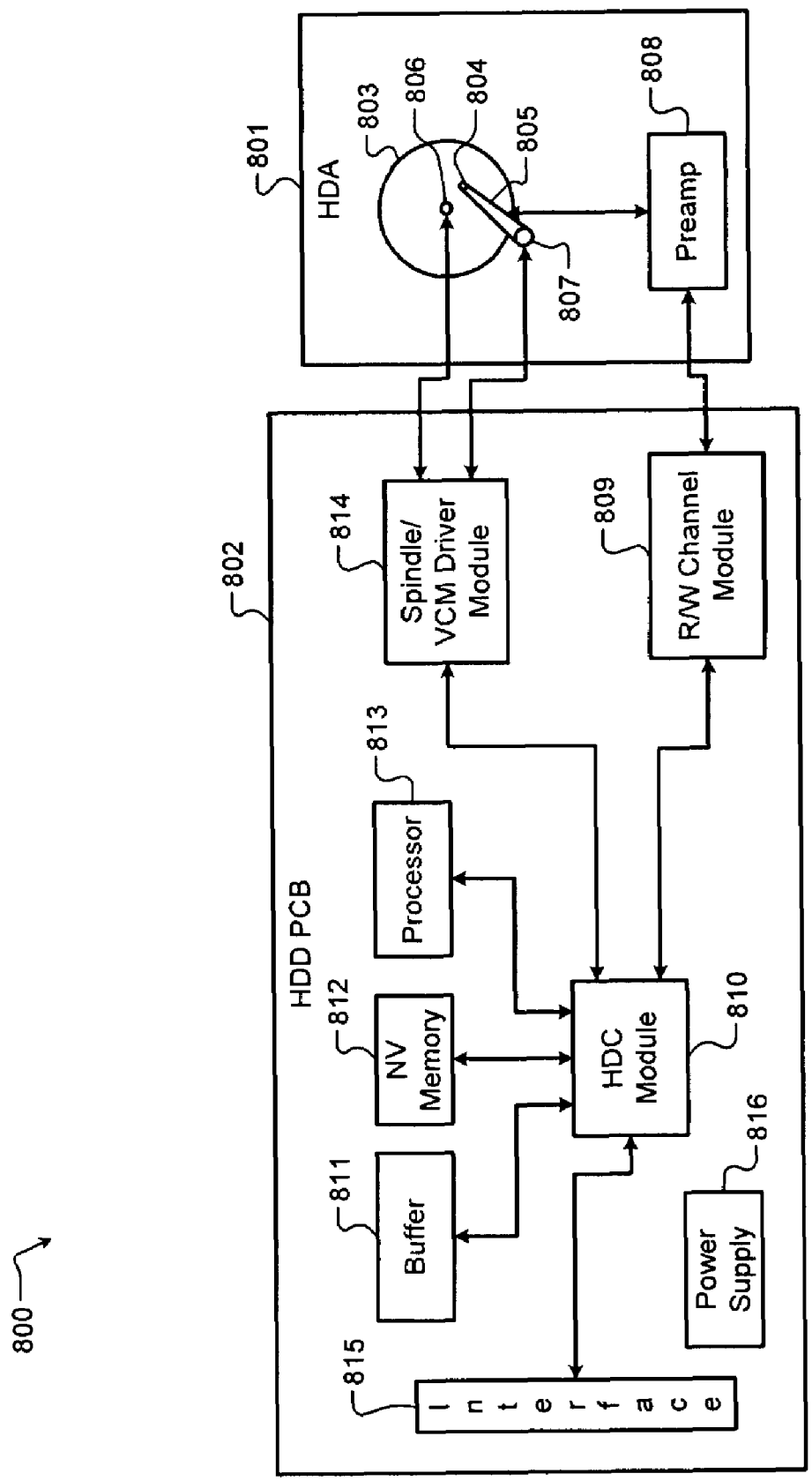
FIG. 8A is a functional block diagram of a hard disk drive.

Referring now to FIG. 8A, the teachings of the disclosure can be implemented in a hard disk controller (HDC) module 810 of a hard disk drive (HDD) 800. The HDD 800 includes a hard disk assembly (HDA) 801 and an HDD printed circuit board (PCB) 802. The HDA 801 may include a magnetic medium 803, such as one or more platters that store data, and a read/write device 804. The read/write device 804 may be arranged on an actuator arm 805 and may read and write data on the magnetic medium 803. Additionally, the HDA 801 includes a spindle motor 806 that rotates the magnetic medium 803 and a voice-coil motor (VCM) 807 that actuates the actuator arm 805. A preamplifier device 808 amplifies signals generated by the read/write device 804 during read operations and provides signals to the read/write device 804 during write operations.

The HDD PCB 802 includes a read/write channel module (hereinafter, "read channel") 809, the HDC module 810, a buffer 811, nonvolatile memory 812, a processor 813, and a spindle/VCM driver module 814. The read channel 809 processes data received from and transmitted to the preamplifier device 808. The HDC module 810 controls components of the HDA 801 and communicates with an external device (not shown) via an I/O interface 815. The external device may include a computer, a multimedia device, a mobile computing device, etc. The I/O interface 815 may include wireline and/or wireless communication links.

The HDC module 810 may receive data from the HDA 801, the read channel 809, the buffer 811, nonvolatile memory 812, the processor 813, the spindle/VCM driver module 814, and/or the I/O interface 815. The processor 813 may process the data, including encoding, decoding, filtering, and/or formatting. The processed data may be output to the HDA 801, the read channel 809, the buffer 811, nonvolatile memory 812, the processor 813, the spindle/VCM driver module 814, and/or the I/O interface 815.

The HDC module 810 may use the buffer 811 and/or nonvolatile memory 812 to store data related to the control and operation of the HDD 800. The buffer 811 may include DRAM, SDRAM, etc. The nonvolatile memory 812 may include flash memory (including NAND and NOR flash memory), phase change memory, magnetic RAM, or multi-state memory, in which each memory cell has more than two states. The spindle/VCM driver module 814 controls the spindle motor 806 and the VCM 807. The HDD PCB 802 includes a power supply 816 that provides power to the components of the HDD 800.

Figure 8B:
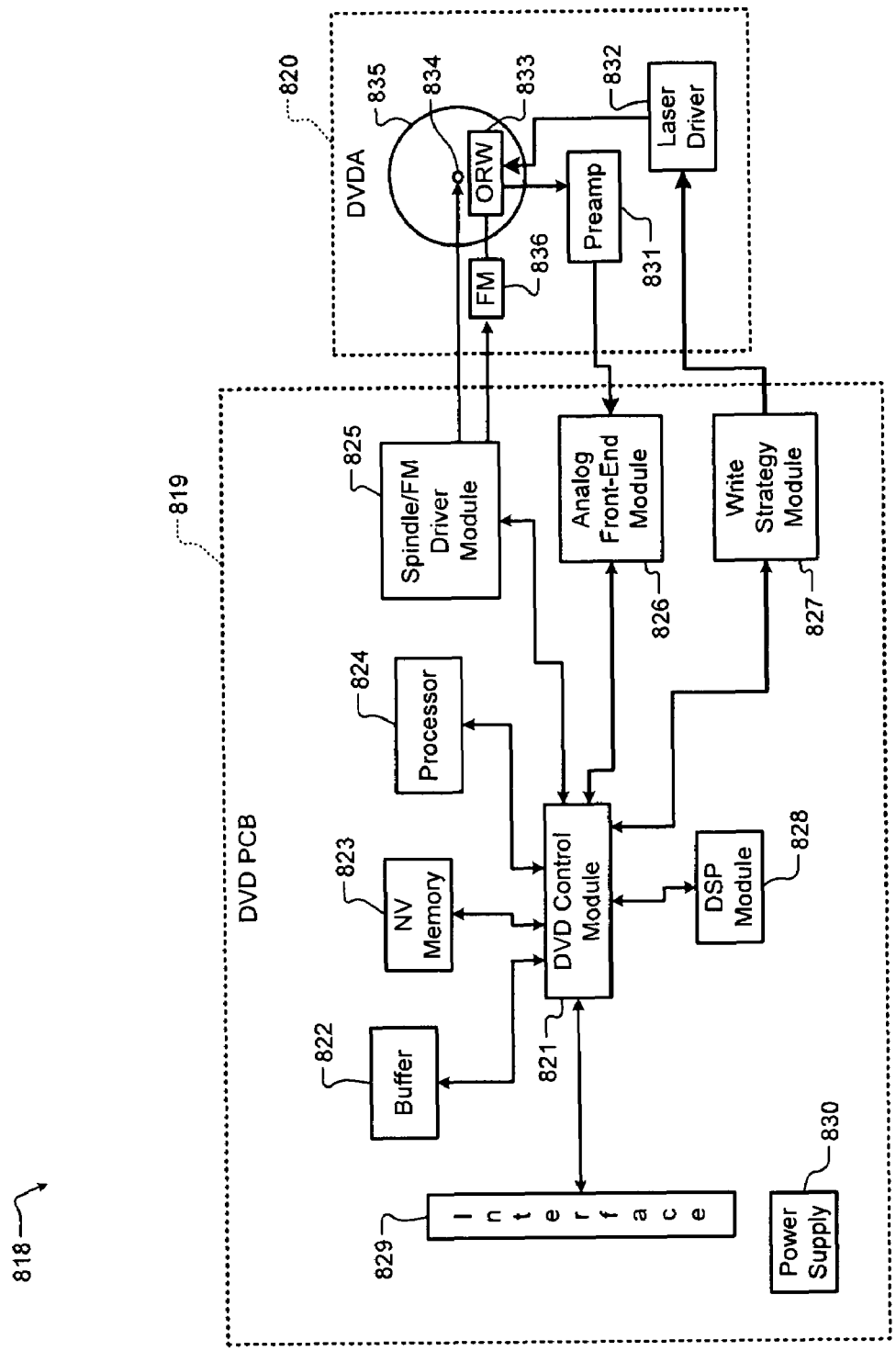
FIG. 8B is a functional block diagram of a DVD drive.

Referring now to FIG. 8B, the teachings of the disclosure can be implemented in a DVD control module 821 of a DVD drive 818 or of a CD drive (not shown). The DVD drive 818 includes a DVD PCB 819 and a DVD assembly (DVDA) 820. The DVD PCB 819 includes the DVD control module 821, a buffer 822, nonvolatile memory 823, a processor 824, a spindle/FM (feed motor) driver module 825, an analog front-end module 826, a write strategy module 827, and a DSP module 828.

The DVD control module 821 controls components of the DVDA 820 and communicates with an external device (not shown) via an I/O interface 829. The external device may include a computer, a multimedia device, a mobile computing device, etc. The I/O interface 829 may include wireline and/or wireless communication links.

The DVD control module 821 may receive data from the buffer 822, nonvolatile memory 823, the processor 824, the spindle/FM driver module 825, the analog front-end module 826, the write strategy module 827, the DSP module 828, and/or the I/O interface 829. The processor 824 may process the data, including encoding, decoding, filtering, and/or formatting. The DSP module 828 performs signal processing, such as video and/or audio coding/decoding. The processed data may be output to the buffer 822, nonvolatile memory 823, the processor 824, the spindle/FM driver module 825, the analog front-end module 826, the write strategy module 827, the DSP module 828, and/or the I/O interface 829.

The DVD control module 821 may use the buffer 822 and/or nonvolatile memory 823 to store data related to the control and operation of the DVD drive 818. The buffer 822 may include DRAM, SDRAM, etc. The nonvolatile memory 823 may include flash memory (including NAND and NOR flash memory), phase change memory, magnetic RAM, or multi-state memory, in which each memory cell has more than two states. The DVD PCB 819 includes a power supply 830 that provides power to the components of the DVD drive 818.

The DVDA 820 may include a preamplifier device 831, a laser driver 832, and an optical device 833, which may be an optical read/write (ORW) device or an optical read-only (OR) device. A spindle motor 834 rotates an optical storage medium 835, and a feed motor 836 actuates the optical device 833 relative to the optical storage medium 835.

When reading data from the optical storage medium 835, the laser driver provides a read power to the optical device 833. The optical device 833 detects data from the optical storage medium 835, and transmits the data to the preamplifier device 831. The analog front-end module 826 receives data from the preamplifier device 831 and performs such functions as filtering and A/D conversion. To write to the optical storage medium 835, the write strategy module 827 transmits power level and timing data to the laser driver 832. The laser driver 832 controls the optical device 833 to write data to the optical storage medium 835.

Figure 8D:
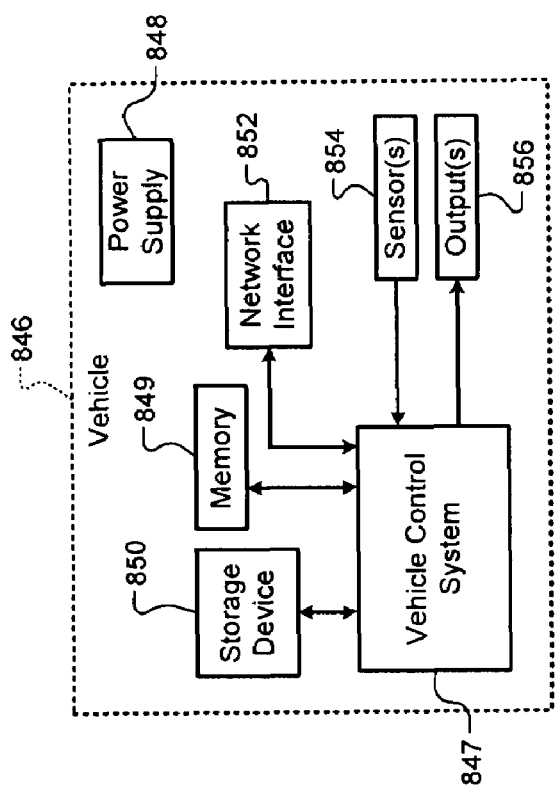
FIG. 8D is a functional block diagram of a vehicle control system.
Figure 8C:
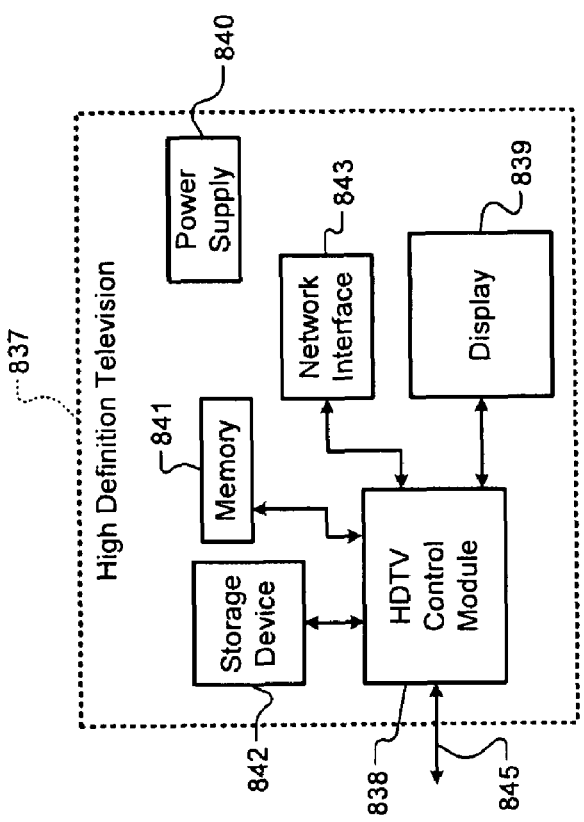
FIG. 8C is a functional block diagram of a high definition television.

Referring now to FIG. 8C, the teachings of the disclosure can be implemented in a high definition television (HDTV) control module 838 of a HDTV 837. The HDTV 837 includes the HDTV control module 838, a display 839, a power supply 840, memory 841, a storage device 842, a network interface 843, and an external interface 845. If the network interface 843 includes a wireless local area network interface, an antenna (not shown) may be included.

The HDTV 837 can receive input signals from the network interface 843 and/or the external interface 845, which can send and receive data via cable, broadband Internet, and/or satellite. The HDTV control module 838 may process the input signals, including encoding, decoding, filtering, and/or formatting, and generate output signals. The output signals may be communicated to one or more of the display 839, memory 841, the storage device 842, the network interface 843, and the external interface 845.

Memory 841 may include random access memory (RAM) and/or nonvolatile memory such as flash memory, phase change memory, or multi-state memory, in which each memory cell has more than two states. The storage device 842 may include an optical storage drive, such as a DVD drive, and/or a hard disk drive (HDD). The HDTV control module 838 communicates externally via the network interface 843 and/or the external interface 845. The power supply 840 provides power to the components of the HDTV 837.

Referring now to FIG. 8D, the teachings of the disclosure may be implemented in a vehicle control system 847 of a vehicle 846. The vehicle 846 may include the vehicle control system 847, a power supply 848, memory 849, a storage device 850, and a network interface 852. If the network interface 852 includes a wireless local area network interface, an antenna (not shown) may be included. The vehicle control system 847 may be a powertrain control system, a body control system, an entertainment control system, an anti-lock braking system (ABS), a navigation system, a telematics system, a lane departure system, an adaptive cruise control system, etc.

The vehicle control system 847 may communicate with one or more sensors 854 and generate one or more output signals 856. The sensors 854 may include temperature sensors, acceleration sensors, pressure sensors, rotational sensors, airflow sensors, etc. The output signals 856 may control engine operating parameters, transmission operating parameters, suspension parameters, etc.

The power supply 848 provides power to the components of the vehicle 846. The vehicle control system 847 may store data in memory 849 and/or the storage device 850. Memory 849 may include random access memory (RAM) and/or nonvolatile memory such as flash memory, phase change memory, or multi-state memory, in which each memory cell has more than two states. The storage device 850 may include an optical storage drive, such as a DVD drive, and/or a hard disk drive (HDD). The vehicle control system 847 may communicate externally using the network interface 852.

Figure 8F:
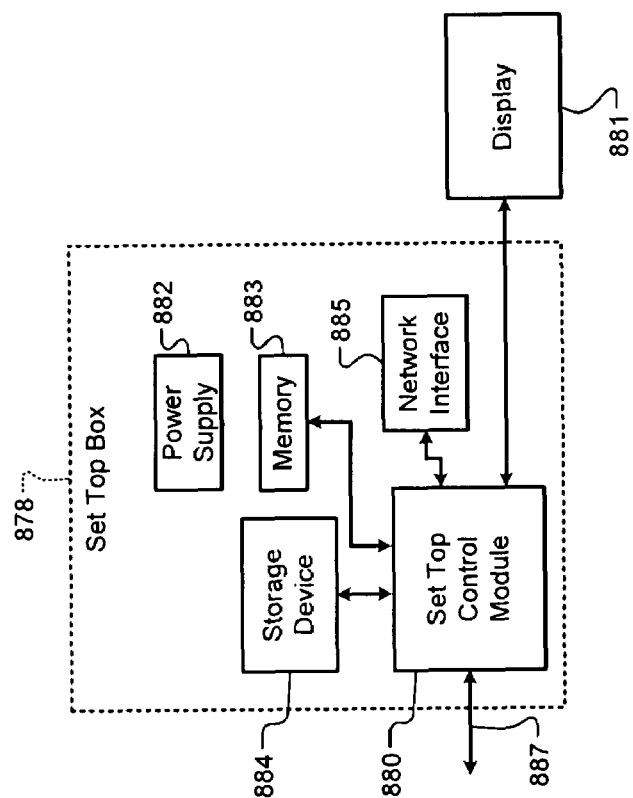
FIG. 8F is a functional block diagram of a set top box.
Figure 8E:
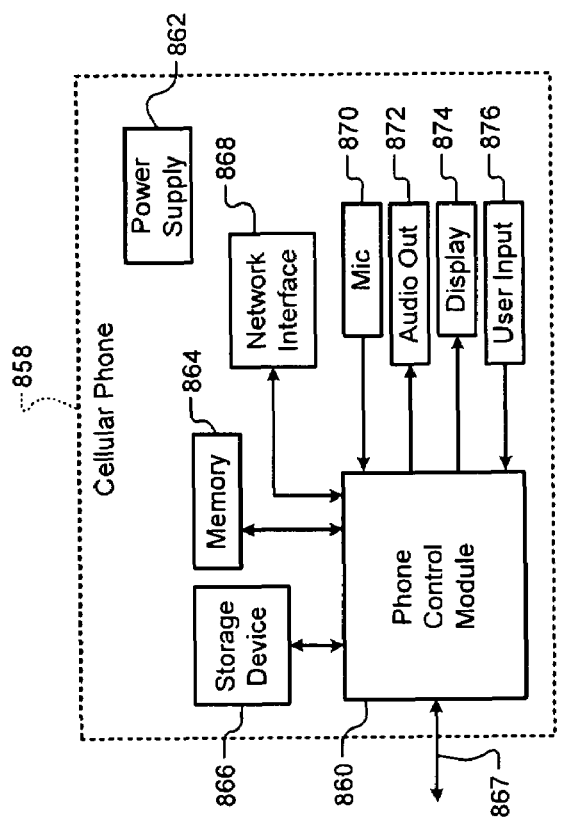
FIG. 8E is a functional block diagram of a cellular phone.

Referring now to FIG. 8E, the teachings of the disclosure can be implemented in a phone control module 860 of a cellular phone 858. The cellular phone 858 includes the phone control module 860, a power supply 862, memory 864, a storage device 866, and a cellular network interface 867. The cellular phone 858 may include a network interface 868, a microphone 870, an audio output 872 such as a speaker and/or output jack, a display 874, and a user input device 876 such as a keypad and/or pointing device. If the network interface 868 includes a wireless local area network interface, an antenna (not shown) may be included.

The phone control module 860 may receive input signals from the cellular network interface 867, the network interface 868, the microphone 870, and/or the user input device 876. The phone control module 860 may process signals, including encoding, decoding, filtering, and/or formatting, and generate output signals. The output signals may be communicated to one or more of memory 864, the storage device 866, the cellular network interface 867, the network interface 868, and the audio output 872.

Memory 864 may include random access memory (RAM) and/or nonvolatile memory such as flash memory, phase change memory, or multi-state memory, in which each memory cell has more than two states. The storage device 866 may include an optical storage drive, such as a DVD drive, and/or a hard disk drive (HDD). The power supply 862 provides power to the components of the cellular phone 858.

Referring now to FIG. 8F, the teachings of the disclosure can be implemented in a set top control module 880 of a set top box 878. The set top box 878 includes the set top control module 880, a display 881, a power supply 882, memory 883, a storage device 884, and a network interface 885. If the network interface 885 includes a wireless local area network interface, an antenna (not shown) may be included.

The set top control module 880 may receive input signals from the network interface 885 and an external interface 887, which can send and receive data via cable, broadband Internet, and/or satellite. The set top control module 880 may process signals, including encoding, decoding, filtering, and/or formatting, and generate output signals. The output signals may include audio and/or video signals in standard and/or high definition formats. The output signals may be communicated to the network interface 885 and/or to the display 881. The display 881 may include a television, a projector, and/or a monitor.

The power supply 882 provides power to the components of the set top box 878. Memory 883 may include random access memory (RAM) and/or nonvolatile memory such as flash memory, phase change memory, or multi-state memory, in which each memory cell has more than two states. The storage device 884 may include an optical storage drive, such as a DVD drive, and/or a hard disk drive (HDD).

Figure 8G:
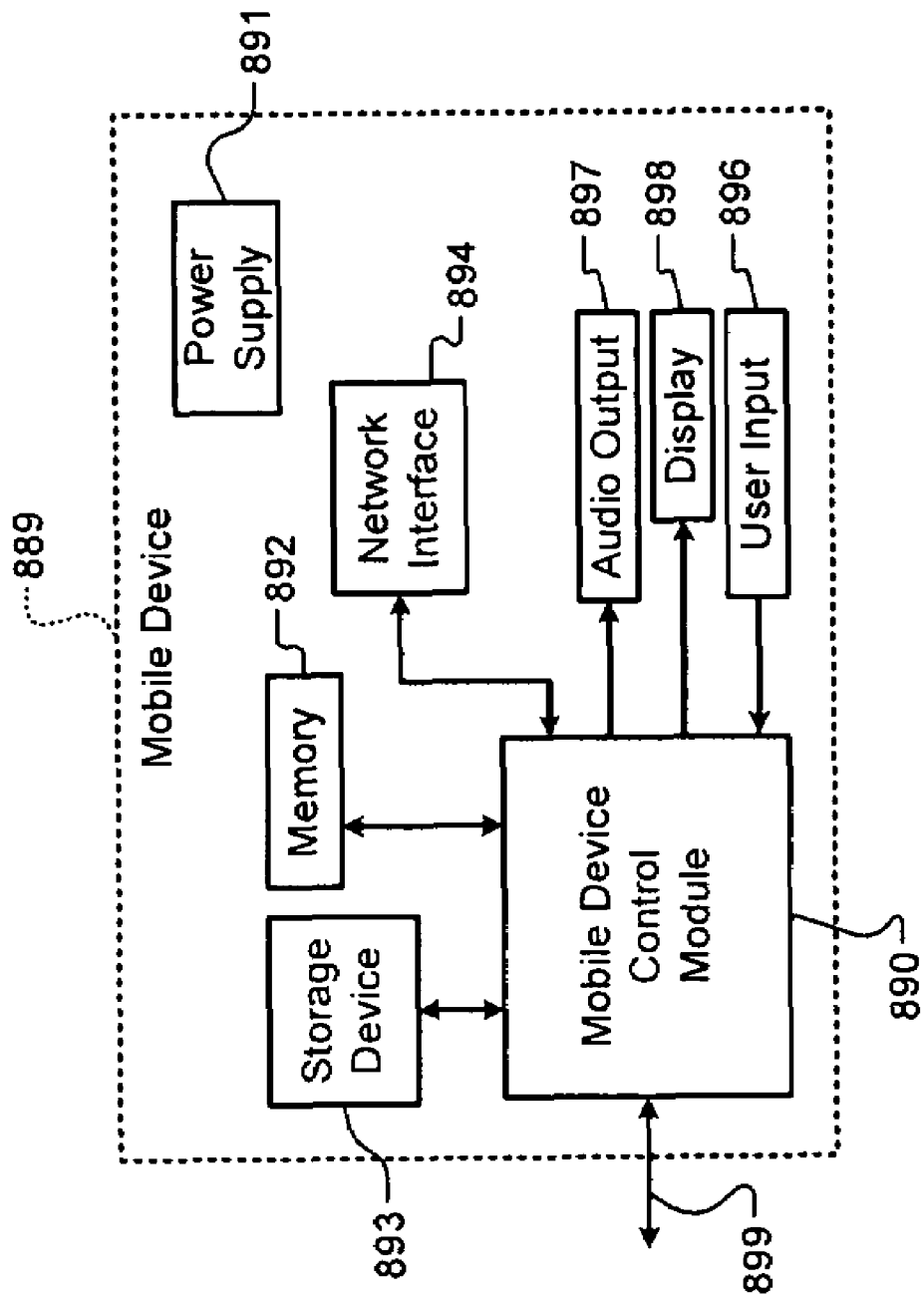
FIG. 8G is a functional block diagram of a mobile device.

Referring now to FIG. 8G, the teachings of the disclosure can be implemented in a mobile device control module 890 of a mobile device 889. The mobile device 889 may include the mobile device control module 890, a power supply 891, memory 892, a storage device 893, a network interface 894, and an external interface 899. If the network interface 894 includes a wireless local area network interface, an antenna (not shown) may be included.

The mobile device control module 890 may receive input signals from the network interface 894 and/or the external interface 899. The external interface 899 may include USB, infrared, and/or Ethernet. The input signals may include compressed audio and/or video, and may be compliant with the MP3 format. Additionally, the mobile device control module 890 may receive input from a user input 896 such as a keypad, touchpad, or individual buttons. The mobile device control module 890 may process input signals, including encoding, decoding, filtering, and/or formatting, and generate output signals.

The mobile device control module 890 may output audio signals to an audio output 897 and video signals to a display 898. The audio output 897 may include a speaker and/or an output jack. The display 898 may present a graphical user interface, which may include menus, icons, etc. The power supply 891 provides power to the components of the mobile device 889. Memory 892 may include random access memory (RAM) and/or nonvolatile memory such as flash memory, phase change memory, or multi-state memory, in which each memory cell has more than two states. The storage device 893 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
   a complementary metal oxide semiconductor (CMOS) receiver;
   a first transistor; and
   a tracking circuit that receives an input voltage and a reference voltage and that selectively biases said first transistor to one of said input voltage and said reference voltage based on a comparison of said input voltage and said reference voltage,
   wherein said CMOS receiver generates an output signal based on said comparison, and
   wherein said tracking circuit comprises a well bias circuit that biases a body of a transistor of said tracking circuit to one of said input voltage and said reference voltage.

2. A system comprising:
   a complementary metal oxide semiconductor (CMOS) receiver;
   a first transistor; and a tracking circuit that receives an input voltage and a reference voltage and that selectively biases said first transistor to one of said input voltage and said reference voltage based on a comparison of said input voltage and said reference voltage, wherein said CMOS receiver generates an output signal based on said comparison, and wherein said tracking circuit biases a control terminal of said first transistor to said reference voltage when said reference voltage exceeds said input voltage, and said tracking circuit biases said control terminal of said first transistor to said input voltage when said input voltage exceeds said reference voltage.

3. A system comprising:

a complementary metal oxide semiconductor (CMOS) receiver;

a first transistor; and a tracking circuit that receives an input voltage and a reference voltage and that selectively biases said first transistor to one of said input voltage and said reference voltage based on a comparison of said input voltage and said reference voltage, wherein said CMOS receiver generates an output signal based on said comparison, wherein said CMOS receiver comprises a first set of transistors that includes said first transistor and a second transistor, and wherein each of said first and second transistors includes a first terminal and a second terminal, said first terminal and said second terminal of said first transistor are coupled to said input voltage and said first terminal of said second transistor, respectively, and said second terminal of said second transistor is coupled to said output signal.

4. The system of claim 3 wherein said tracking circuit includes:

a second set of transistors comprising a third transistor and a fourth transistor; and a well bias circuit that selectively biases respective bodies of said third transistor and said fourth transistor to one of said reference voltage and said input voltage.

5. The system of claim 4 wherein said well bias circuit includes:

a third set of transistors comprising a fifth transistor and a sixth transistor, wherein each of said fifth and sixth transistors include a first terminal, a second terminal, and a control terminal.

6. The system of claim 5 wherein said well bias circuit selectively biases the respective bodies of said third transistor and said fourth transistor based on a body signal at one of said first terminal of said fifth transistor and said first terminal of said sixth transistor.

7. The system of claim 5 wherein said first terminal, said second terminal, and said control terminal of said fifth transistor are coupled to said first terminal of said sixth transistor, said input voltage, and said reference voltage, respectively, and said second terminal and said control terminal of said sixth transistor are coupled to said reference voltage and said input voltage, respectively.

8. The system of claim 7 wherein said first terminal of said fifth transistor is further coupled to a body of said fifth transistor, and said first terminal of said sixth transistor is further coupled to a body of said sixth transistor.

9. The system of claim 1 wherein said output signal is less than or equal to a maximum operating voltage of said CMOS receiver.

10. The system of claim 3 wherein said first set of transistors includes n-channel metal oxide semiconductor (NMOS) transistors.

11. The system of claim 4 wherein said second set of transistors includes p-channel metal oxide semiconductor (PMOS) transistors.

12. The system of claim 5 wherein said third set of transistors includes p-channel metal oxide semiconductor (PMOS) transistors.

13. The system of claim 1 wherein said CMOS receiver further comprises a hysteresis circuit.

14. The system of claim 1 wherein said CMOS receiver further comprises a level shifter circuit.

15. A system comprising:

complementary metal oxide semiconductor (CMOS) receiver means for processing an input signal;

a first transistor; and tracking means for receiving an input voltage and a reference voltage and for selectively biasing said first transistor to one of said input voltage and said reference voltage based on a comparison of said input voltage and said reference voltage, wherein said CMOS receiver means generates an output signal based on said comparison, and wherein said tracking means biases said first transistor to the greater one of said input voltage and said reference voltage.

16. The system of claim 15 wherein said tracking means biases a control terminal of said first transistor to said reference voltage when said reference voltage exceeds said input voltage, and said tracking means biases said control terminal of said first transistor to said input voltage when said input voltage exceeds said reference voltage.

17. The system of claim 15 wherein said CMOS receiver means further comprises:

a first set of transistors that includes said first transistor and a second transistor, wherein each of said first and second transistors includes a first terminal and a second terminal, said first terminal and said second terminal of said first transistor are coupled to said input voltage and said first terminal of said second transistor, respectively, and said second terminal of said second transistor is coupled to said output signal.

18. The system of claim 17 wherein said tracking means includes:

a second set of transistors comprising a third transistor and a fourth transistor; and well bias means for selectively biasing respective bodies of said third transistor and said fourth transistor to one of said reference voltage and said input voltage.

19. The system of claim 18 wherein said well bias means includes:

a third set of transistors comprising a fifth transistor and a sixth transistor, wherein each of said fifth and sixth transistors include a first terminal, a second terminal, and a control terminal.

20. The system of claim 19 wherein said well bias means selectively biases the respective bodies of said third transistor and said fourth transistor based on a body signal at one of said first terminal of said fifth transistor and said first terminal of said sixth transistor.

21. The system of claim 19 wherein said first terminal, said second terminal, and said control terminal of said fifth transistor are coupled to said first terminal of said sixth transistor, said input voltage, and said reference voltage, respectively, and said second terminal and said control terminal of said sixth transistor are coupled to said reference voltage and said input voltage, respectively.

22. The system of claim 21 wherein said first terminal of said fifth transistor is further coupled to a body of said fifth transistor and said first terminal of said sixth transistor is further coupled to a body of said sixth transistor.

23. The system of claim 15 wherein said output signal is less than or equal to a maximum operating voltage of said CMOS receiver means.

24. The system of claim 17 wherein said first set of transistors includes n-channel metal oxide semiconductor (NMOS) transistors.

25. The system of claim 18 wherein said second set of transistors includes p-channel metal oxide semiconductor (PMOS) transistors.

26. The system of claim 19 wherein said third set of transistors includes p-channel metal oxide semiconductor (PMOS) transistors.

27. The system of claim 15 wherein said CMOS receiver means further comprises hysteresis means for providing hysteresis to said output signal.

28. The system of claim 15 wherein said CMOS receiver means further comprises level shifter means for shifting a level of said output signal.

29. A method of operating a complementary metal oxide semiconductor (CMOS) receiver, the method comprising:
  receiving an input voltage and a reference voltage at a tracking circuit;
  comparing said input voltage and said reference voltage;
  selectively biasing a first transistor to one of said input voltage and said reference voltage based on said comparison;
  generating an output signal based on said comparison; and
  biasing a body of a transistor of said tracking circuit to one of said input voltage and said reference voltage.

30. A method of operating a complementary metal oxide semiconductor (CMOS) receiver, the method comprising:
  receiving an input voltage and a reference voltage at a tracking circuit;
  comparing said input voltage and said reference voltage;
  selectively biasing a first transistor to one of said input voltage and said reference voltage based on said comparison;
  generating an output signal based on said comparison;
  biasing a control terminal of said first transistor to said reference voltage when said reference voltage exceeds said input voltage; and
  biasing said control terminal of said first transistor to said input voltage when said input voltage exceeds said reference voltage.

31. A method of operating a complementary metal oxide semiconductor (CMOS) receiver, the method comprising:
  receiving an input voltage and a reference voltage at a tracking circuit;
  comparing said input voltage and said reference voltage;
  selectively biasing a first transistor to one of said input voltage and said reference voltage based on said comparison;
  generating an output signal based on said comparison; and
  providing a first set of transistors that includes said first transistor and a second transistor,
  wherein each of said first and second transistors includes a first terminal and a second terminal, said first terminal and said second terminal of said first transistor are coupled to said input voltage and said first terminal of said second transistor, respectively, and said second terminal of said second transistor is coupled to said output signal.

32. The method of claim 31 further comprising:
  providing a second set of transistors comprising a third transistor and a fourth transistor; and
  selectively biasing respective bodies of said third transistor and said fourth transistor to one of said reference voltage and said input voltage.

33. The method of claim 32 further comprising:
  providing a third set of transistors comprising a fifth transistor and a sixth transistor,
  wherein each of said fifth and sixth transistors include a first terminal, a second terminal, and a control terminal.

34. The method of claim 33 further comprising:
  selectively biasing the respective bodies of said third transistor and said fourth transistor based on a body signal at one of said first terminal of said fifth transistor and said first terminal of said sixth transistor.

35. The method of claim 33 wherein said first terminal, said second terminal, and said control terminal of said fifth transistor are coupled to said first terminal of said sixth transistor, said input voltage, and said reference voltage, respectively, and said second terminal and said control terminal of said sixth transistor are coupled to said reference voltage and said input voltage, respectively.

36. The method of claim 35 wherein said first terminal of said fifth transistor is further coupled to a body of said fifth transistor, and said first terminal of said sixth transistor is further coupled to a body of said sixth transistor.

37. The method of claim 29 wherein said output signal is less than or equal to a maximum operating voltage of said CMOS receiver.

38. The method of claim 31 wherein said first set of transistors includes n-channel metal oxide semiconductor (NMOS) transistors.

39. The method of claim 32 wherein said second set of transistors includes p-channel metal oxide semiconductor (PMOS) transistors.

40. The method of claim 33 wherein said third set of transistors includes p-channel metal oxide semiconductor (PMOS) transistors.

41. The method of claim 29 wherein said CMOS receiver further comprises a hysteresis circuit.

42. The method of claim 29 wherein said CMOS receiver further comprises a level shifter circuit.

43. The system of claim 1 wherein said well bias circuit biases said body to the greater one of said reference voltage and said input voltage.

44. The method of claim 29 wherein said body is biased to the greater one of said reference voltage and said input voltage.

* * * * *